US006892365B2

(12) United States Patent
Culp et al.

(10) Patent No.: US 6,892,365 B2
(45) Date of Patent: May 10, 2005

(54) METHOD FOR PERFORMING MONTE-CARLO SIMULATIONS TO PREDICT OVERLAY FAILURES IN INTEGRATED CIRCUIT DESIGNS

(75) Inventors: James A. Culp, Downington, PA (US); Mark A. Lavin, Katonah, NY (US); Robert T. Sayah, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 10/249,524

(22) Filed: Apr. 16, 2003

(65) Prior Publication Data

US 2004/0210863 A1 Oct. 21, 2004

(51) Int. Cl.[7] ............................................. G06F 17/50
(52) U.S. Cl. ................................... 716/4; 716/5; 716/6
(58) Field of Search ........................... 716/4–6; 714/724, 714/737, 738; 700/121; 382/144–145; 356/401

(56) References Cited

U.S. PATENT DOCUMENTS

| 5,124,927 | A | * | 6/1992 | Hopewell et al. ........... 700/121 |
| 5,712,707 | A | * | 1/1998 | Ausschnitt et al. ......... 356/401 |
| 6,738,954 | B1 | * | 5/2004 | Allen et al. .................... 716/4 |
| 6,803,554 | B2 | * | 10/2004 | Ye et al. ................... 250/208.1 |
| 2001/0021546 | A1 | * | 9/2001 | Suwa ........................... 438/200 |
| 2003/0204348 | A1 | * | 10/2003 | Suzuki et al. ................. 702/83 |
| 2003/0223630 | A1 | * | 12/2003 | Adel et al. ................... 382/145 |

OTHER PUBLICATIONS

Moosa, M.S. et al, "Simulating IC Reliability with Emphasis on Process–Flaw Related Early Failures" IEEE Transactions on Reliability, vol. 44, No. 4, Dec. 1995, pp. 556–561.*
Kim, T. et al, "Modeling Manufacturing Yield and Reliability" IEEE Transactions on Semiconductor Manufacturing, vol. 12, No. 4 Nov. 1999, pp. 485–492.*

* cited by examiner

Primary Examiner—Vuthe Siek
Assistant Examiner—Naum Levin
(74) Attorney, Agent, or Firm—DeLio & Peterson LLC; Peter W. Peterson; H. Daniel Schnurmann

(57) ABSTRACT

A method of predicting overlay failure of circuit configurations on adjacent, lithographically produced layers of a semiconductor wafer comprises providing design configurations for circuit portions to be lithographically produced on one or more adjacent layers of a semiconductor wafer, and then predicting shape and alignment for each circuit portions on each adjacent layer using one or more predetermined values for process fluctuation or misalignment error. The method then determines dimension of overlap of the predicted shape and alignment of the circuit portions, and compares the determined dimension of overlap to a theoretical minimum to determine whether the predicted dimension of overlap fails. Using different process fluctuation values and misalignment error values, the steps are then iteratively repeated on the provided design configurations to determine whether the predicted dimension of overlap fails, and a report is made of the measure of failures.

19 Claims, 4 Drawing Sheets

METHOD FOR PERFORMING MONTE-CARLO SIMULATIONS TO PREDICT OVERLAY FAILURES IN INTEGRATED CIRCUIT DESIGNS

BACKGROUND OF INVENTION

This invention relates to the lithographic production of integrated circuits and, in particular, to a method of predicting overlay failure of circuit configurations on adjacent, lithographically produced layers of a semiconductor wafer.

The integrated circuit fabrication process consists of a series of steps which begins with an input set of geometries or configurations of integrated circuit patterns provided by the very large scale integration (VLSI) designer and results in a manufactured integrated circuit chip consisting of devices and interconnects which perform a needed function. Exposure tools print the integrated circuit patterns by lithographic methods on successive layers of a semiconductor wafer. These lithographic methods are well known and include using a photo mask to project the image of the circuit portion onto a resist layer, developing the resist layer, removing portions of the resist layer to recreate the circuit portion image on the wafer layer, and then etching and depositing desired circuit materials on or in the wafer layer. The exposure tools achieve registration of each integrated circuit pattern among different pattern layers by aligning the integrated circuit portion on a current layer to an integrated circuit portion on a previously patterned layer. Precise control is important to minimize alignment and overlay error of the integrated circuit portions between circuit layers made by a lithographic process.

Each step in the manufacturing process introduces a certain amount of error, which causes the final resulting manufactured chip pattern design to deviate somewhat from that originally provided by the designer. Some of the places where errors are introduced are: 1) imperfections in the physical realization of the photo mask, 2) shape image distortion in the lithographic process used to expose wafers, 3) variations in the process across a single chip and/or wafer, 4) variations in the process from wafer to wafer, and 5) misalignment of photo masks from adjacent layers (overlay error).

In some cases, extra steps in the process are added in order to compensate for these imperfections. Examples include optical proximity correction, selective line-width biasing and the addition of line-end anchor shapes. In other cases, the imperfections lead to some conservatism in the design process. The usual embodiment of this conservatism is in the values associated with the design rules, which state what the minimum widths, spacings, and overlaps are for designs created in a given technology. Since the design rules are the primary vehicle for communicating the capabilities of the process from the technology developers to the chip designers, the rules must be set to values that can produce a reasonable yield for all possible geometries or configurations under all possible process conditions in consideration of all of the potential sources of error.

In reality, however, certain geometries or configurations or circuit portions are much more susceptible to failure than others. For example, it is well known that corners tend to round, and line-ends tend to shorten. Additionally, the importance of each of these imperfections varies greatly with the intended purpose of the particular geometry. For example, if a line end of a metal shape foreshortens, it is likely of little concern if there is no via in the vicinity of the foreshortening. However, the same foreshortening becomes of greater concern if that foreshortening, combined with other process imperfections, causes the amount of overlap with a neighboring via to be less than that necessary to provide a reliable electrical connection to the adjacent layer of metal.

In determining the design rule values for a particular technology, current techniques consist of a monte-carlo simulation of simple geometric shapes in simple geometric configurations. Simplistic rule-based assumptions are made about issues such as corner rounding and line-end foreshortening, and then the shapes are offset randomly in order to simulate overlay error. Because the geometries must remain simple in order to apply the simplistic rule-based assumptions, accurate results are only obtained for a simplistic set of geometries, and not the full set of geometries and shape configurations that can be seen in a typical VLSI design.

Once provided with a set of layout rules, the designer proceeds to produce a circuit layout based upon those rules which implement the intended functionality of the circuit, unit or chip. Since the designer has knowledge that different geometric configurations of shapes can result in different on-wafer images, he may be inclined to do a small amount of model-based simulation on areas of his design that he deems to be particularly critical, and that he predicts may be susceptible to failure. Such simulations are performed under a single set of process conditions with no good method for incorporating overlay error. These methods also require the layout designer to have good insights into those areas that are susceptible to failure.

In certain cases, in order to achieve an especially tight layout, a designer may intentionally violate certain layout rules. In these circumstances, he requests a waiver to the design rules for his particular geometric configuration of shapes from the waiver review board for the particular technology. Typically, the waiver granting determination is based upon the extensive experience of the collective members of the board, in some instances along with a small amount of process simulation performed on the particular geometries.

In each one of these areas, the vast complexity involved with the geometric configurations that can or do occur leads to inaccuracies, usually leading to overly conservative design geometries.

SUMMARY OF INVENTION

Bearing in mind the problems and deficiencies of the prior art, it is therefore an object of the present invention to provide a method of predicting overlay failure of integrated circuit configurations on adjacent, lithographically produced layers of a semiconductor wafer.

It is another object of the present invention to provide a method for improving integrated circuit design accuracy.

A further object of the invention is to provide a method which allows for collection of more detailed information over a range of geometries, process conditions and overlay error in the production of integrated circuits.

The above and other objects and advantages, which will be apparent to one of skill in the art, are achieved in the present invention which is directed to, in a first aspect, a method of predicting overlay failure of circuit configurations on adjacent, lithographically produced layers of a semiconductor wafer. The method comprises providing design configurations for circuit portions to be lithographically produced on one or more adjacent layers of a semiconductor wafer, and then predicting shape and alignment for each design configuration for the circuit portions on each adjacent layer using one or more predetermined values for process fluctuation or misalignment error during lithographic manufacturing of the circuit portions on the adjacent layers of the semiconductor wafer. The method then comprises determining dimension of overlap of the predicted shape and alignment of the circuit portions on the adjacent layers of the semiconductor wafer, and comparing the determined dimension of overlap of the predicted shape and alignment of the circuit portions to a theoretical minimum required dimension of overlap of the circuit portions to determine whether the dimension of overlap of the predicted shape and alignment of the circuit portions fails. Using different process fluctuation values and misalignment error values, the method then further comprises iteratively repeating the aforementioned steps on the provided design configurations for the circuit portions to determine whether the dimension of overlap of the predicted shape and alignment of the circuit portions fails, and subsequently reporting a measure of failures of dimension of overlap for the predicted shape and alignment of the provided design configurations for circuit portions.

In a related aspect, the present invention is directed to a method of predicting overlay failure of circuit configurations on adjacent, lithographically produced layers of a semiconductor wafer comprising providing design configurations for circuit portions to be lithographically produced on adjacent layers of a semiconductor wafer, and providing a value for process fluctuation during photolithographic exposure of the circuit portions on the adjacent layers of the semiconductor wafer. Using the process fluctuation value, the method then simulates shape-distorting effects of photolithographic exposure for each design configuration for the circuit portions on each adjacent layer to provide predicted shapes of the circuit portions. The method also comprises providing an error value for misalignment of the circuit portions on the adjacent layers of the semiconductor wafer, and applying the misalignment error value to the predicted shapes of the circuit portions to simulate misalignment of the circuit portions on the adjacent layers of the semiconductor wafer and provide misalign-predicted shapes of the circuit portions. The method then determines area of overlap of the misalign-predicted shapes of the circuit portions on the adjacent layers of the semiconductor wafer, and compares the determined area of overlap of the misalign-predicted shapes of the circuit portions to a theoretical minimum required area of overlap of the circuit portions to determine whether the area of overlap of the misalign-predicted shapes of the circuit portions fails. Using different process fluctuation values and misalignment error values, the method then includes iteratively repeating the aforementioned steps on the provided design configurations for the circuit portions to determine whether the area of overlap of the misalign-predicted shapes of the circuit portions fails, and subsequently reporting a measure of failures of area of overlap for the misalign-predicted shapes of the provided design configurations for circuit portions.

The values for process fluctuation or misalignment error may be provided by random variation.

The shape-distorting effects of photolithographic exposure for each design configuration for the circuit portions on each adjacent layer may be based on variation in dose or focus, or on shape biasing, during photolithographic exposure. The shape biasing variation may be provided as a different fixed value, or as a random variation, during each repeat of the method steps.

Preferably, during each iteration of the method steps, the simulation of shape-distorting effects of photolithographic exposure for each design configuration for the circuit portions on each adjacent layer is by i) simulating shape-distorting effects based on variation in dose or focus during photolithographic exposure to provide nominal-predicted shapes of the circuit portions and ii) resizing the nominal-predicted shapes of the circuit portions with a shape biasing value to provide biased-predicted shapes of the circuit portions. In such case, the misalignment error value is applied to the biased-predicted shapes of the circuit portions to simulate misalignment of the circuit portions.

The shape-distorting effects of photolithographic exposure for each design configuration for the circuit portions on each adjacent layer may additionally, or alternately, be based on variation in etching during photolithographic exposure.

The method may further include providing a database and wherein, for each iteration of the method steps, the determined dimension of overlap of the predicted shape and alignment of the circuit portions is stored in the database. A report may be made of minimum determined area of overlap of the misalign-predicted shapes of the circuit portions stored in the database, or of percentage of iterations having failure of area of overlap for the misalign-predicted shapes of the circuit portions stored in the database. Such report may also include determining three-sigma value of area of overlap for the misalign-predicted shapes of the circuit portions stored in the database and a list of design configurations having highest probability of failure.

In a related aspect, the present invention may include an article of manufacture comprising a computer-usable medium having computer readable program code means embodied therein for predicting overlay failure of circuit configurations on adjacent, lithographically produced layers of a semiconductor wafer, based on design configurations for circuit portions to be lithographically produced on one or more adjacent layers of a semiconductor wafer. The computer readable program code means in the article of manufacture comprises computer readable program code means for practicing the aforementioned method steps. The present invention also provides a program storage device readable by a machine, tangibly embodying a program of instructions executable by the machine to perform method steps for predicting overlay failure of circuit configurations on adjacent, lithographically produced layers of a semiconductor wafer, based on design configurations for circuit portions to be lithographically produced on one or more adjacent layers of a semiconductor wafer. The method steps on the program storage device are those described above.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
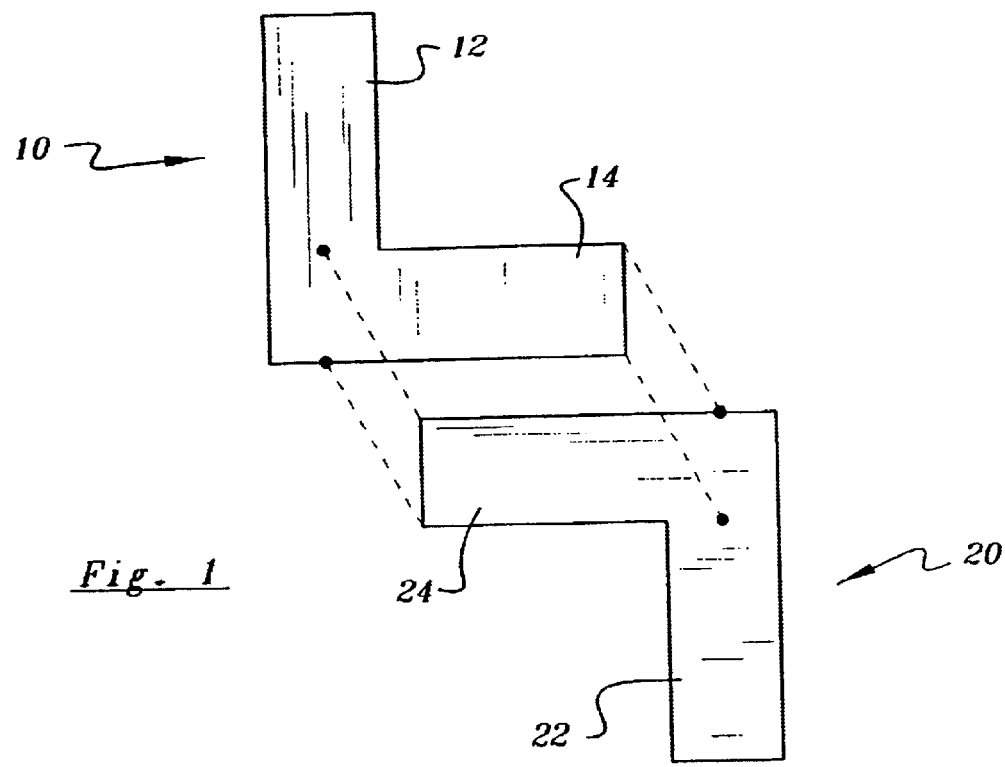
FIG. 1 is a top plan view of ideal portions of an integrated circuit design configuration to be formed on adjacent layers of a semiconductor wafer.

In describing the preferred embodiment of the present invention, reference will be made herein to FIGS. 1–6 of the drawings in which like numerals refer to like features of the invention. Features of the invention are not necessarily shown to scale in the drawings.

The present invention provides a method for gathering statistics as to, and predicting, the susceptibility of failure of specific geometries on one or more physically adjacent layers in a circuit design with respect to variations in the manufacturing process. The method involves the performing of monte-carlo simulations specific to a given technology, and introduction of random variation for both overlay error and the process itself.

Figure 2:
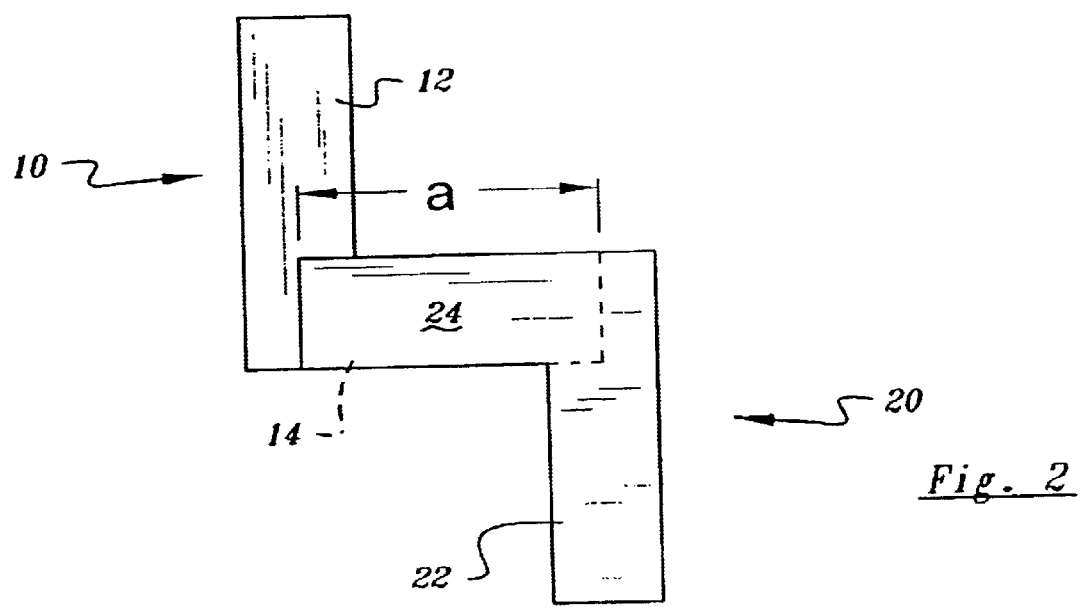
FIG. 2 is a top plan view of the ideal portions of the circuit design configurations of FIG. 1 after they are overlaid on one another on adjacent layers of a semiconductor wafer.

FIG. 1 shows ideal portions of an integrated circuit configuration, as designed, which are intended to be formed on adjacent layers of a semiconductor wafer. Designed circuit portion 10 to be formed on a first wafer layer consists of, for example, a metal deposition having a first leg 12 and a second leg 14. Designed circuit portion 20, also a metal deposition, is to be formed on a second wafer layer and consists of first leg 22 and second leg 24. The first and second wafer layers are to be superimposed over and adjacent to one another, so that leg 24 of circuit 20 overlays and contacts leg 14 of circuit 10, as shown by the dotted lines. By otherwise conventional photolithographic manufacturing techniques, the images of circuit portions 10 and 20 are sequentially projected onto a resist layer, developed, and removed from the resist layer. The remaining developed resist layer is then used for etching a similar opening in the wafer layer, after which metal is deposited. The idealized result of the circuit manufacturing process is shown in FIG. 2, where circuit leg portions 14 and 24 are overlaid and in contact as adjacent wafer layers. Leg portions 14 and 24 have a theoretical design overlap length dimension a.

In practicing the method of the present invention, a series of input circuit layout geometries or configurations is provided, such as those shown in FIG. 1. The series of circuit layout geometries or configurations may represent an actual circuit design, or may be a series of test patterns which are being used for purposes of evaluating ground rules for a specific technology. In either case, these circuit configurations are intended to be representative of the geometric data from which a photo mask would be manufactured. These circuit configurations, although shown for a single layer, interact and join with circuit configurations of one or more adjacent layers to form the circuit devices and wiring needed to make up the integrated circuits on the completed semiconductor wafer. The present invention may be used to predict overlay failure on one, two, or more adjacent lithographically produced layers.

Figure 3:
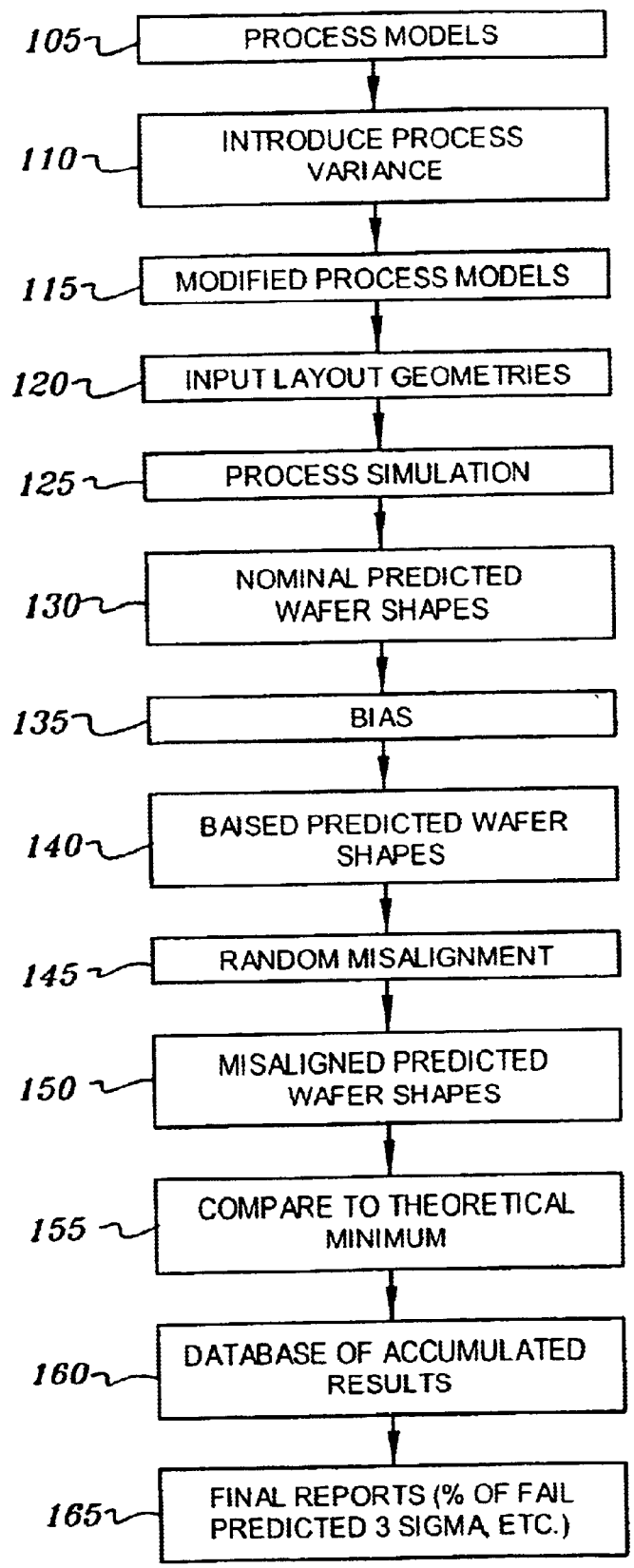
FIG. 3 is a flow chart of the preferred method of the present invention for predicting overlay failure of integrated circuit configurations on adjacent, lithographically produced layers of a semiconductor wafer.

As depicted in the flow chart in FIG. 3, there are initially provided one or more models that can predict the shape-distorting effects of photolithographic exposure during the manufacturing process, 105. These models are well known in the art. A separate model is provided for each layer of the design that contains geometries or configurations whose ultimate embodiment on the wafer impacts the statistics to be gathered. Parameters which describe the random variation in the lithographic process window are introduced, 110. There are two preferred basic methods for simulating this random variation. Either method may be used independently, or they may both be used together.

In the first preferred method of modifying process models, 115, random variation may be introduced in the parameters which describe the model itself, for example optical effects such as dose and/or focus of the energy beam used to expose the circuit design image onto the resist layer. Other optical variables include optical proximity effects as a result of the specific configuration of the circuit portion or nearby circuit portions. In addition, variables that affect final circuit configuration as a result of lithographic exposure may be introduced, such as etching time or other variables that affect the degree of etching. As is known, variations in dose and focus of the circuit pattern aerial image affect the dimensions of the latent image of the pattern in the resist layer, and the degree of etching affects the mask opening produced for depositing the metal for the circuit. All of these variables affect the final dimensions of the circuit portion. Previously calculated 3 σ values for a Gaussian distribution of the final circuit configuration, including dimensions, are provided for each input parameter which is intended to be varied, and a fundamentally new model is generated on each iteration.

After simulations are performed, 125, using the input circuit layout geometries previously described, 120, and the potentially modified models, 115, there is produced a set of predicted configurations or shapes of the circuit portions, the first of which are the nominal predicted circuit or wafer shapes, 130.

In the second preferred method of modifying process models, introducing random variation is simulated by shape biasing, 135. In shape biasing, instead of modeling specific photolithographic exposure variables, a specific input value for shape biasing is provided to increase or decrease the configuration of the design circuit portion. This value is meant to allow for simulating process fluctuations, and is faster and easier than running actual process models. This value may either represent a fixed bias, or a 3 σ value for a Gaussian distribution of previously calculated biasing results. If the value represents the latter, then an actual bias value is computed randomly according to the defined distribution. If biasing is to be done to the nominal predicted wafer shapes, they are resized by any bias value selected or determined to produce biased predicted wafer shapes, 140. Again, process simulation 125 and/or bias simulation 135 may be performed together, or one or the other may be used by itself.

Figure 4:
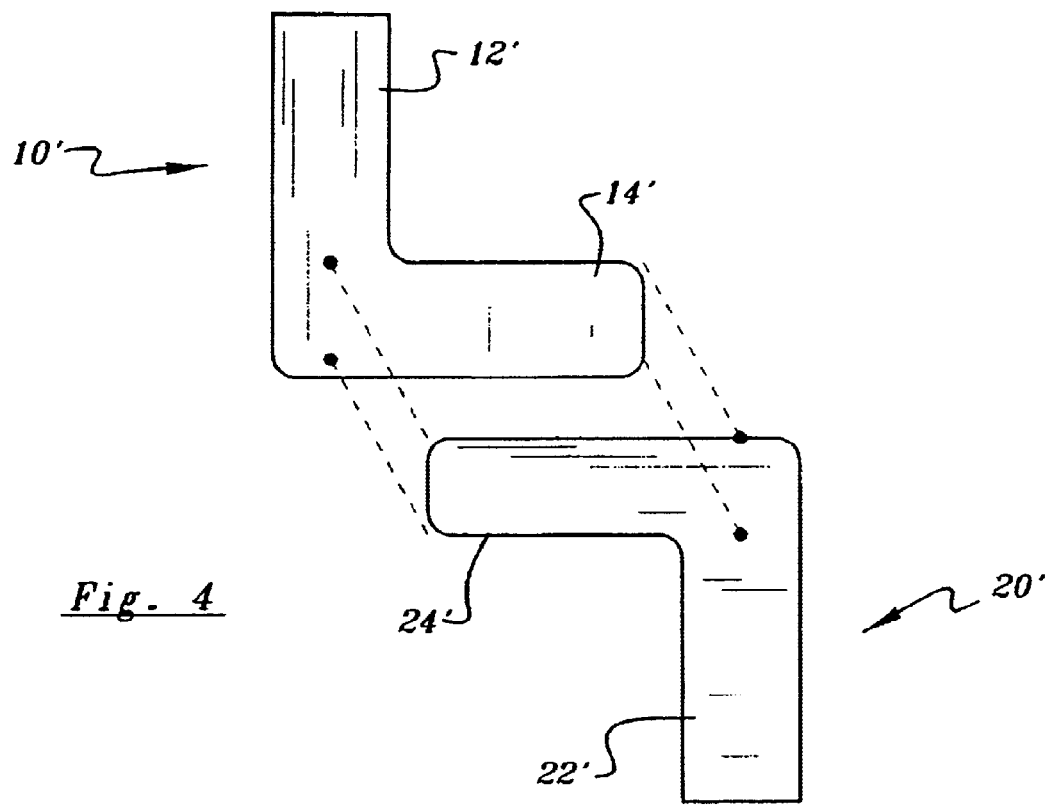
FIG. 4 is a top plan view showing process simulations to the integrated circuit design configuration portions on adjacent layers shown in FIG. 1.

Typical geometric output from the modified process models is depicted in FIG. 4. The initial design circuit portions 10 and 20 are now shown as predicted shapes 10' and 20' as they would be separately lithographically produced on adjacent layers of the wafer. To conserve processing, only leg portions 14' and 24' to be overlaid are predicted, and non-overlaid leg portions 12' and 22' are not. The circuit leg portions 14', 24' show the processing effects predicted in steps 105–140 described above.

Figure 5:
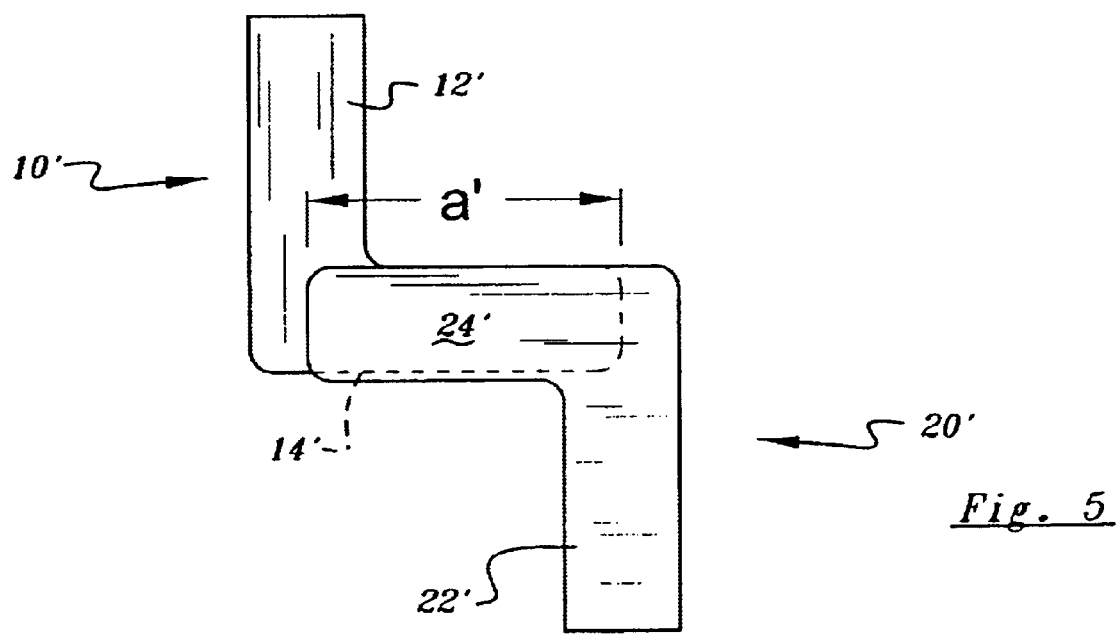
FIG. 5 is a top plan view of the process simulations of the circuit design configurations portions of FIG. 4 after they are overlaid on one another on adjacent layers of a semiconductor wafer.

Subsequently, in step 145 (FIG. 3), an input value for misalignment error is provided. This value may either represent a fixed misalignment error, or a previously calculated 3 σ value for a Gaussian distribution of misalignment error expected in the manufacturing process. If the value represents the latter, then an actual misalignment value is computed randomly according to the defined distribution. If the misalignment error value is not 0, then a random misalignment direction is computed. The predicted circuit or wafer shapes from steps 130 and/or 140 are translated with respect to each other according to the misalignment distance and direction determined in step 145 to produce misalign-predicted wafer shapes, 150. The result of this step on the predicted circuit configurations of FIG. 4 is represented in FIG. 5, which shows the predicted circuit portions 10' and 20' in their final relationship on the wafer, with predicted circuit leg portion 24' overlaid over predicted circuit leg portion 14'. The various misalign-predicted wafer shapes are then measured against each other and compared to a theoretical minimum value, 155 (FIG. 3), in order to determine when failures are occurring. For example, in the case of measuring for two layer overlap as shown in FIG. 5, the misalign-predicted wafer shapes of each layer are intersected with each other and the resulting intersection area is then measured and compared against a provided theoretical minimum area of overlap. This predicted overlap length a' is shown in FIG. 5. Other overlap dimensions may also be predicted, such as predicted overlap width, to determine the predicted area of overlap between circuit portions 14' and 24'. If the measured area or other dimension is less than the desired minimum, then the particular design configuration or geometry, such as that shown in FIGS. 1 and 2, is considered to be failing under this set of process conditions.

Continuing in FIG. 3, the above-described steps 110 to 155 are repeated a specified number of times. Statistics are accumulated for each specific design configuration or geometry in the input layout geometries, 120. The results are stored in a database of accumulated results, 160. When all iterations are complete, a final report is produced, 165. Information in this report may include minimum measured geometric value, percentage of iterations which failed, and predicted 3 σ geometric value. Also, the report may include a list of design configurations having the highest probability of failure. A separate reporting is preferably made for each circuit configuration or geometry in the set of input layout geometries.

Figure 6:
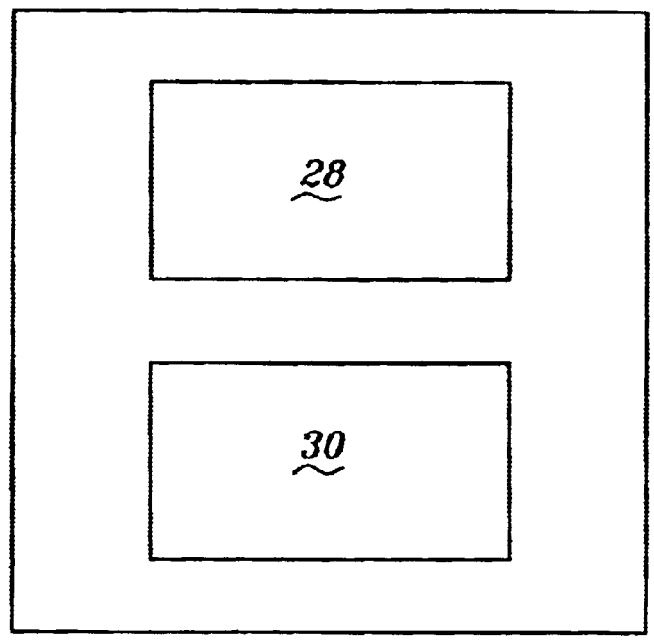
FIG. 6 is a schematic of a computer system employed to implement the preferred method of the present invention for predicting overlay failure of integrated circuit configurations.

The method of the present invention for predicting overlay failure of circuit configurations may be implemented by a computer program or software incorporating the process steps and instructions described above in otherwise conventional program code and stored on an otherwise conventional program storage device. As shown in FIG. 6, the program code, as well as any input information required, may be stored in computer 26 on program storage device 28, such as a semiconductor chip, a read-only memory, magnetic media such as a diskette or computer hard drive, or optical media such as a CD or DVD ROM. Computer system 26 has a microprocessor 30 for reading and executing the stored program code in device 28 in the manner described above.

Thus, for the purpose of determining appropriate design rule values for a specific technology, the reports produced in step 165 may then be used to collate information about 3 σ values for different geometric configurations in consideration of the predicted on-wafer circuit images. That knowledge can be used to make a well-informed decision regarding appropriate design rule values. This is in contrast to the current practice in which 3 σ values are obtained based upon a simplistic notion of phenomenon such as corner-rounding and line-end-foreshortening. Further, for the purpose of modifying circuit designs in a manner that makes them less susceptible to failure, the reports provide the designer with information about the percent of fail for each particular circuit configuration or geometry. The designer can use this information to prioritize the geometries which require the greatest improvement. This is in contrast to the current practice which requires a manual inspection of the results of simulation under one certain set of process conditions with little indication of which geometries are most susceptible to failure. Additionally, for the purpose of determining whether or not the granting of a waiver to a design rule for a specific design should be issued, the waiver review team now has detailed information available about the specific geometry for which the waiver is being requested. This is in contrast to the current practice which employs general knowledge about the geometries in question.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of predicting overlay failure of circuit configurations on adjacent, lithographically produced layers of a semiconductor wafer comprising:

providing design configurations for circuit portions to be lithographically produced on layers of a semiconductor wafer;

predicting shape and alignment for each design configuration for the circuit portions on each adjacent layer using one or more predetermined values for process fluctuation or misalignment error during lithographic manufacturing of the circuit portions on the adjacent layers of the semiconductor wafer;

determining dimension of overlap of the predicted shape and alignment of the circuit portions on the adjacent layers of the semiconductor wafer;

comparing the determined dimension of overlap of the predicted shape and alignment of the circuit portions to a theoretical minimum required dimension of overlap of the circuit portions to determine whether the dimension of overlap of the predicted shape and alignment of the circuit portions fails;

using different process fluctuation values and misalignment error values, iteratively repeating the aforementioned steps on the provided design configurations for the circuit portions to determine whether the dimension of overlap of the predicted shape and alignment of the circuit portions fails; and reporting a measure of failures of dimension of overlap for the predicted shape and alignment of the provided design configurations for circuit portions.

2. The method of claim 1 wherein the values for process fluctuation or misalignment error are provided by random variation.

3. The method of claim 1 further including providing a database and wherein, for each iteration of the method steps, the determined dimension of overlap of the predicted shape and alignment of the circuit portions is stored in the database.

4. A method of predicting overlay failure of circuit configurations on adjacent, lithographically produced layers of a semiconductor wafer comprising:

providing design configurations for circuit portions to be lithographically produced on adjacent layers of a semiconductor wafer;

providing a value for process fluctuation during photolithographic exposure of the circuit portions on the adjacent layers of the semiconductor wafer;

using the process fluctuation value, simulating shape-distorting effects of photolithographic exposure for each design configuration for the circuit portions on each adjacent layer to provide predicted shapes of the circuit portions;

providing an error value for misalignment of the circuit portions on the adjacent layers of the semiconductor wafer;

applying the misalignment error value to the predicted shapes of the circuit portions to simulate misalignment of the circuit portions on the adjacent layers of the semiconductor wafer and provide misalign-predicted shapes of the circuit portions;

determining area of overlap of the misalign-predicted shapes of the circuit portions on the adjacent layers of the semiconductor wafer;

comparing the determined area of overlap of the misalign-predicted shapes of the circuit portions to a theoretical minimum required area of overlap of the circuit portions to determine whether the area of overlap of the misalign-predicted shapes of the circuit portions fails;

using different process fluctuation values and misalignment error values, iteratively repeating the aforementioned steps on the provided design configurations for the circuit portions to determine whether the area of overlap of the misalign-predicted shapes of the circuit portions fails; and reporting a measure of failures of area of overlap for the misalign-predicted shapes of the provided design configurations for circuit portions.

5. The method of claim 4 wherein the process fluctuation values are provided by random variation.

6. The method of claim 4 wherein the misalignment error values are provided by random variation.

7. The method of claim 4 wherein the shape-distorting effects of photolithographic exposure for each design configuration for the circuit portions on each adjacent layer are based on variation in dose or focus during photolithographic exposure.

8. The method of claim 4 wherein the shape-distorting effects of photolithographic exposure for each design configuration for the circuit portions on each adjacent layer are based on variation in shape biasing during photolithographic exposure.

9. The method of claim 8 wherein the shape biasing variation is provided as a different fixed value during each repeat of the method steps.

10. The method of claim 8 wherein the shape biasing variation is provided as a random variation during each repeat of the method steps.

11. The method of claim 4 wherein, during each iteration of the method steps, the simulation of shape-distorting effects of photolithographic exposure for each design configuration for the circuit portions on each adjacent layer is by i) simulating shape-distorting effects based on variation in dose or focus during photolithographic exposure to provide nominal-predicted shapes of the circuit portions and ii) resizing the nominal-predicted shapes of the circuit portions with a shape biasing value to provide biased-predicted shapes of the circuit portions; and wherein the misalignment error value is applied to the biased-predicted shapes of the circuit portions to simulate misalignment of the circuit portions.

12. The method of claim 4 further including providing a database and wherein, for each iteration of the method steps, the determined area of overlap of the misalign-predicted shapes of the circuit portions is stored in the database.

13. The method of claim 12 further including reporting minimum determined area of overlap of the misalign-predicted shapes of the circuit portions stored in the database.

14. The method of claim 12 wherein the reporting includes percentage of iterations having failure of area of overlap for the misalign-predicted shapes of the circuit portions stored in the database.

15. The method of claim 12 including determining three-sigma value of area of overlap for the misalign-predicted shapes of the circuit portions stored in the database.

16. The method of claim 12 wherein the reporting includes a list of design configurations having highest probability of failure.

17. The method of claim 4 wherein the shape-distorting effects of photolithographic exposure for each design configuration for the circuit portions on each adjacent layer are based on variation in etching during photolithographic exposure.

18. An article of manufacture comprising a computer-usable medium having computer readable program code means embodied therein for predicting overlay failure of circuit configurations on adjacent, lithographically produced layers of a semiconductor wafer, based on design configurations for circuit portions to be lithographically produced on one or more adjacent layers of a semiconductor wafer, the computer readable program code means in said article of manufacture comprising:

computer readable program code means for predicting shape and alignment for each design configuration for the circuit portions on each adjacent layer using one or more predetermined values for process fluctuation or misalignment error during lithographic manufacturing of the circuit portions on the adjacent layers of the semiconductor wafer;

computer readable program code means for determining dimension of overlap of the predicted shape and alignment of the circuit portions on the adjacent layers of the semiconductor wafer;

computer readable program code means for comparing the determined dimension of overlap of the predicted shape and alignment of the circuit portions to a theoretical minimum required dimension of overlap of the circuit portions to determine whether the dimension of overlap of the predicted shape and alignment of the circuit portions fails;

computer readable program code means for iteratively repeating the aforementioned functions on the provided design configurations for the circuit portions, using different process fluctuation values and misalignment error values, to determine whether the dimension of overlap of the predicted shape and alignment of the circuit portions fails; and computer readable program code means for reporting a measure of failures of dimension of overlap for the predicted shape and alignment of the provided design configurations for circuit portions.

19. A program storage device readable by a machine, tangibly embodying a program of instructions executable by the machine to perform method steps for predicting overlay failure of circuit configurations on adjacent, lithographically produced layers of a semiconductor wafer, based on design configurations for circuit portions to be lithographically produced on one or more adjacent layers of a semiconductor wafer, said method steps comprising:

predicting shape and alignment for each design configuration for the circuit portions on each adjacent layer using one or more predetermined values for process fluctuation or misalignment error during lithographic manufacturing of the circuit portions on the adjacent layers of the semiconductor wafer;

determining dimension of overlap of the predicted shape and alignment of the circuit portions on the adjacent layers of the semiconductor wafer;

comparing the determined dimension of overlap of the predicted shape and alignment of the circuit portions to a theoretical minimum required dimension of overlap of the circuit portions to determine whether the dimension of overlap of the predicted shape and alignment of the circuit portions fails;

using different process fluctuation values and misalignment error values, iteratively repeating the aforementioned steps on the provided design configurations for the circuit portions to determine whether the dimension of overlap of the predicted shape and alignment of the circuit portions fails; and reporting a measure of failures of dimension of overlap for the predicted shape and alignment of the provided design configurations for circuit portions.

* * * * *